United States Patent
Henderson

(10) Patent No.: US 7,123,485 B1
(45) Date of Patent: Oct. 17, 2006

(54) TECHNIQUES FOR MOVING A POWER SUPPLY WITHIN AN ELECTRONIC CABINET

(75) Inventor: David Henderson, Shirley, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 11/008,861

(22) Filed: Dec. 10, 2004

(51) Int. Cl.
H05K 5/00 (2006.01)
H05K 7/00 (2006.01)
A47B 57/00 (2006.01)
B65G 65/00 (2006.01)

(52) U.S. Cl. .............. 361/724; 361/679; 211/209; 414/279

(58) Field of Classification Search ............ 361/679, 361/724–727; 211/209; 414/279
See application file for complete search history.

(56) References Cited

U.S. PATENT DOCUMENTS

| | | | | |
|---|---|---|---|---|
| 1,928,420 A | * | 9/1933 | Graves, Jr. ............ | 361/607 |
| 2,057,084 A | * | 10/1936 | Cornell et al. .......... | 361/615 |
| 2,707,666 A | * | 5/1955 | Becker .................. | 212/329 |
| 4,563,120 A | * | 1/1986 | Josserand .............. | 414/273 |
| 5,431,493 A | * | 7/1995 | Larson .................. | 312/268 |
| 5,510,955 A | * | 4/1996 | Taesang ................ | 361/685 |
| 6,310,783 B1 | * | 10/2001 | Winch et al. ........... | 361/797 |
| 6,875,935 B1 | * | 4/2005 | Abrahamsen et al. ..... | 200/50.24 |
| 2002/0108507 A1 | * | 8/2002 | May et al. ............. | 100/45 |
| 2003/0221914 A1 | * | 12/2003 | Smith et al. ........... | 187/244 |
| 2004/0094495 A1 | * | 5/2004 | Bouche ................. | 211/187 |

* cited by examiner

Primary Examiner—Lisa Lea-Edmonds
Assistant Examiner—Zachary Pape
(74) Attorney, Agent, or Firm—BainwoodHuang

(57) ABSTRACT

An electronic cabinet includes a base, and an electronic cabinet frame which extends vertically from the base. The electronic cabinet frame is configured to support electronic circuitry. The electronic cabinet further includes a power supply positioning assembly having (i) a mounting mechanism mounted to the electronic cabinet frame, (ii) a carrier which is configured to carry at least one power supply and move along a vertical axis within the electronic cabinet frame while carrying the power supply, and (iii) control linkage which is configured to guide movement of the carrier while the carrier carries the power supply and while the carrier moves along the vertical axis.

20 Claims, 5 Drawing Sheets

TECHNIQUES FOR MOVING A POWER SUPPLY WITHIN AN ELECTRONIC CABINET

BACKGROUND

In general, an electronic cabinet is a large enclosure which houses electronic equipment. Such a cabinet typically provides access to the electronic equipment through a front opening at a front of the cabinet and a rear opening at the rear of the cabinet. Accordingly, manufacturers typically position electronic circuitry requiring relatively frequent access adjacent the front opening, and other electronic circuitry requiring relatively frequent access adjacent the rear opening. For example, some conventional data storage systems have arrays of hot-swappable disk drives at the front opening of the cabinet, and hot-swappable processor and memory modules at the rear opening of cabinet to service the disk drives.

Additionally, manufacturers typically locate power units that provide power to the electronic equipment in static locations which are out of the way of the electronic circuitry which requires frequent access. One conventional data storage system layout has power units statically located at the bottom of the cabinet where the power units do not interfere with access to the disk drives and the circuit board modules. Access to these components is unobstructed because the power units are (i) adjacent the front opening at the bottom of the cabinet or, alternatively, (ii) adjacent the rear opening at the bottom of the cabinet. Accordingly, a technician has easy access to circuits at both the front and rear of the cabinet without removing a power unit thus enabling the data storage system to remain powered-up and operational.

Another conventional data storage system layout has power units, which are elongated in shape, stacked in a static column in the middle of the cabinet. Here, a front portion of each power unit is adjacent the front opening of the cabinet and is flush with an array of disk drives which are distributed on both sides of the column of power units and which are also adjacent the front opening of the cabinet. Additionally, a rear portion of each power unit is adjacent the rear opening of the cabinet and is thus accessible through the rear opening. Again, a technician has easy access to circuits at the front and rear of the cabinet without removing a power unit from the middle column thus allowing the data storage system to remain powered-up and operational during access.

SUMMARY

Unfortunately, there are deficiencies to the above-described conventional data storage system layouts. For example, in connection with the above-described conventional data storage system layout having power units statically positioned at the bottom of the cabinet near the front opening or the rear opening of the cabinet, the power units take up space that could otherwise be used for other circuits. In particular, if the power units are statically located toward the front opening at the bottom of the cabinet, the power units consume space that could be used to contain more disk drives. Similarly, if the power units are statically located toward the rear opening at the bottom of the cabinet, the power units consume space that could contain circuit board modules which service adjacent disk drives at the front of the cabinet.

Additionally, in connection with the above-described conventional data storage system layout having power units which are elongated in shape and stacked in a static column in the middle of the cabinet, the power units displace disk drives and circuit board modules. Accordingly, this layout prevents the manufacturer from positioning circuitry at both the front and rear of the cabinet.

In contrast to the above-described conventional data storage system layouts, embodiments of the invention are directed to techniques for moving a power supply along a vertical axis within an electronic cabinet. Preferably, such techniques enable the power supply to continue to provide power to circuitry within the cabinet for sustained operation (i.e., high availability) while a user moves the power supply along the vertical axis in order to obtain unhindered access to circuitry initially obstructed behind the power supply. Accordingly, a manufacturer is capable of optimizing utilization of the front and rear of the cabinet while maintaining complete access to the frequently accessed circuits. For example, in the context of a data storage system, a manufacturer is capable of placing maximum disk drive density at the front of the cabinet and maximum circuit board module density at the rear of the cabinet, with none of the circuitry being inconveniently concealed by a power supply since a user can simply move the power supply out of the way along the vertical axis while the data storage system remains up and running.

One embodiment of the invention is directed to an electronic cabinet having a base, and an electronic cabinet frame which extends vertically from the base. The electronic cabinet frame is configured to support electronic circuitry (e.g., data storage system hardware). The electronic cabinet further includes a power supply positioning assembly having (i) a mounting mechanism mounted to the electronic cabinet frame (e.g., at a top of the frame), (ii) a carrier which is configured to carry to a power supply (or multiple power supplies) and move along a vertical axis within the electronic cabinet frame while carrying the power supply, and (iii) control linkage (e.g., a pulley sub-system) which is configured facilitate movement of the carrier while the carrier carries the power supply and while the carrier moves along the vertical axis.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for moving a power supply along a vertical axis within an electronic cabinet. Preferably, such techniques enable the power supply to continue to provide power to circuitry within the cabinet while a user moves the power supply along the vertical axis thus permitting sustained operation (i.e., high availability). As a result, a manufacturer is capable of optimizing utilization of both the front and rear of the cabinet while maintaining complete access to frequently accessed circuits. For example, in the context of a data storage system, a manufacturer is capable of placing maximum disk drive density at the front of the cabinet and maximum circuit board module density at the rear of the cabinet, with none of the circuitry being inconveniently concealed by a power supply since a user can move the power supply out of the way along the vertical axis while the data storage system remains up and running.

Figure 1:
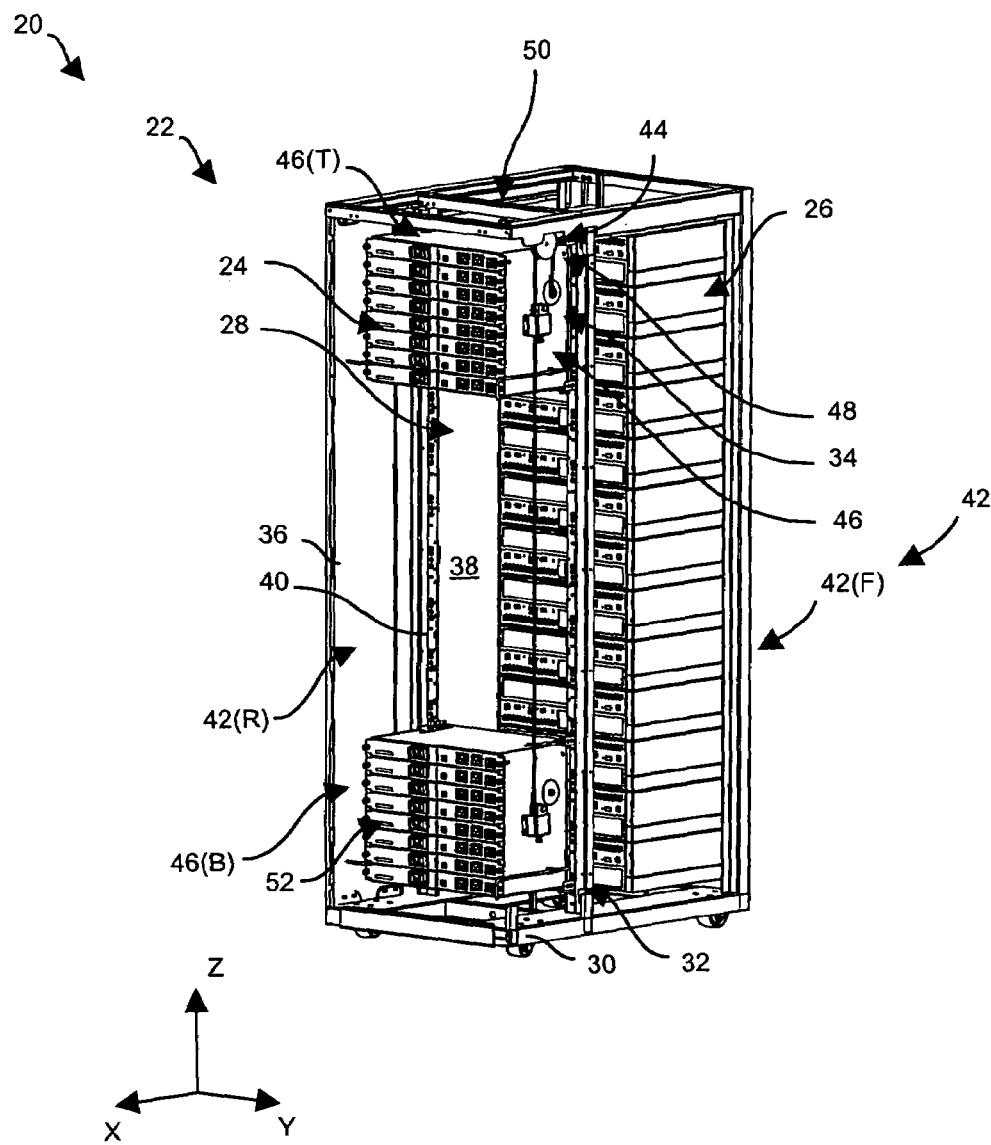
FIG. 1 is a perspective view of an electronic system which is suitable for use by the invention.

FIG. 1 shows a perspective view of an electronic system 20 which is suitable for use by the invention. The electronic system 20, which is shown from a rear angle, includes an electronic cabinet 22, a power supply subsystem 24, electronic circuitry 26, and a cable management subsystem 28 (shown generally by the arrow 28 in FIG. 1 for simplicity). The electronic cabinet 22 includes a base 30, an electronic cabinet frame 32, a power supply positioning assembly 34 and panels 36 (e.g., a front door, a rear door, side panels, a top vent or hood, etc.). Only portions of the frame 32 and one side panel 36 are shown in FIG. 1 for simplicity.

The electronic cabinet frame 32 extends vertically (i.e., along the Z-axis) from the base 30, and defines an interior space 38 within which the power supply subsystem 24, the electronic circuitry 26 and the cable management subsystem 28 reside. The electronic cabinet frame 32 includes support members 40 (e.g., vertical and horizontal rails) which provide mechanical support for the power supply subsystem 24, the electronic circuitry 26 and the panels 36. As shown in FIG. 1, the electronic cabinet frame 32 further defines a front opening 42(F) and a rear opening 42(R) which is opposite the front opening 42(F) (collectively, openings 42). A user is capable of accessing the electronic circuitry 26 through the front opening 42(F). Additionally, the user is capable of accessing the electronic circuitry 26, the power supply subsystem 24, and the cable management subsystem 28 through the rear opening 42(R).

As further shown in FIG. 1, the power supply positioning assembly 34 includes a mounting mechanism 44, carriers 46(T), 46(B) (collectively, carriers 46) and control linkage 48 (e.g., a set of pulleys). The mounting mechanism 44 mounts to a top portion 50 (e.g., a horizontal support member 40) of the electronic cabinet frame 32. The carriers 46 carry the power supply subsystem 24 (e.g., individual power supplies 52) and are capable of being moved by a user along a vertical axis (i.e., the Y-axis) defined by the electronic cabinet frame 32.

The control linkage 48, which is coupled to the carriers 46 and to the mounting mechanism 44, is configured to facilitate movement of the carriers 46 when the user moves the carriers 46 along the vertical axis. The cable management subsystem 28 (e.g., a flexible network of power cables, cable supports and guides, etc.) is capable of maintaining connectivity between the power supply subsystem 24 and the electronic circuitry 26 thus enabling the electronic system 20 to remain operational while the user moves the carriers 46 along the vertical axis. That is, the cable management subsystem 28 is configured to continue to convey power from the power supply subsystem 24 to the electronic circuitry 26 even while the user changes the positions of the carriers 46.

By way of example only, the electronic system 20 is shown in the context of a fault tolerant data storage system which is configured to store and retrieve data on behalf of one or more external host computers. In this context, the electronic circuitry 26 includes an array of storage devices 60 (e.g., rows and columns of disk drives) which are accessible through the front opening 42(F) of the cabinet 30, circuit board modules 62 (e.g., field replaceable units) which are accessible through the rear opening 42(R) of the cabinet 30. Such a configuration allows for maximization of storage device density at the front opening 42(F) (i,e., maximum disk drive density) and simultaneous maximization of circuit board module density at the rear opening 42(R) (i.e., maximum circuit board density for servicing the disk drives) without concealing or impeding hot-swapping access to the any of the circuitry 60, 62. In particular, if the user is initially obstructed from accessing any of the circuit board modules 62, the user is capable of simply operating the power supply positioning assembly 34 to move the carriers 46 along the vertical axis to different locations to provide convenient access to those circuit board modules 62. Such movement of the carriers 46 is capable of occurring while the power supply subsystem 24 provides power to the electronic circuitry 26 through the cable management subsystem 28 thus enabling the user to perform hot-swapping of any circuit board module 62 while the data storage system as a whole remains in operation. Further details of the electronic system 20 will now be provided with reference to FIG. 2.

Figure 2:
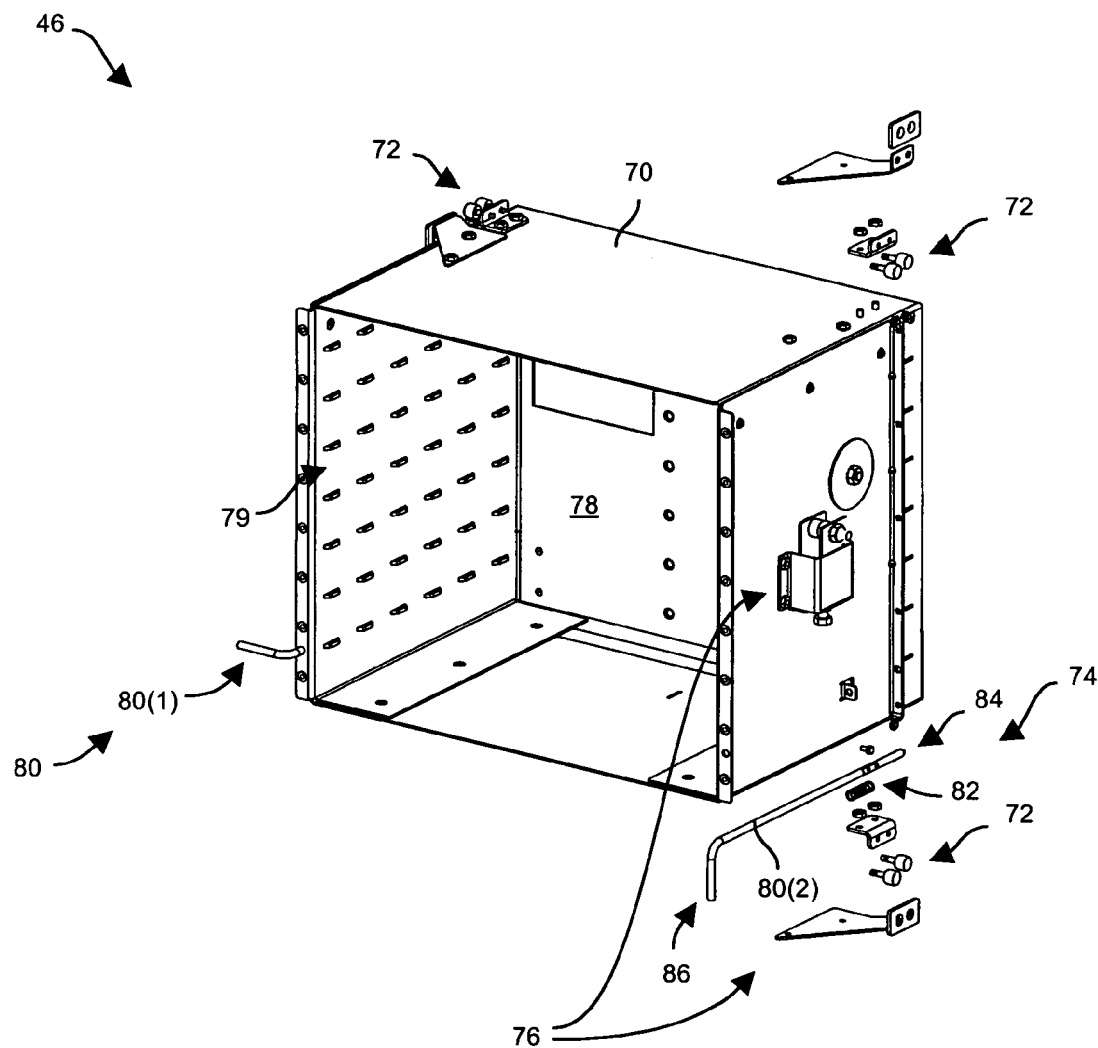
FIG. 2 is an exploded view of a portion of a power supply positioning assembly of the system of FIG. 1

FIG. 2 is an exploded view of a carrier 46 of the power supply positioning assembly 34. The carrier 46 includes a chassis 70, rollers or wheels 72, a locking mechanism 74, and various connection hardware 76. The chassis 70 preferably defines an interior space 78 and a set of slots 79 to hold the individual power supplies 52 of the power supply subsystem 24 within the interior space 78 so that the devices 52 are substantially parallel to each other in a stacked arrangement. The connection hardware 76 is configured to connect the rollers 72, the locking mechanism 74 and the control linkage 48 (e.g., the ends of pulley cables) to the chassis 70.

The locking mechanism 74 includes a set of levers 80(1), 80(2) and a set of respective springs 82(1), 82(2) (collectively, springs 82) configured to bias the set of levers 80(1), 80(2) (collectively, levers 80) into locking engagement with the electronic cabinet frame 34 (also see FIG. 1). In particular, each lever 80 has a first end 84 configured to lock the chassis 70 to a vertical support member (or rail) 40 and a second end 86 configured to be pulled by a user when the user wishes to unlock the chassis 70 from the vertical support member 40. Further details of the electronic system 20 will now be provided with reference to FIGS. 3 through 5.

Figure 3:
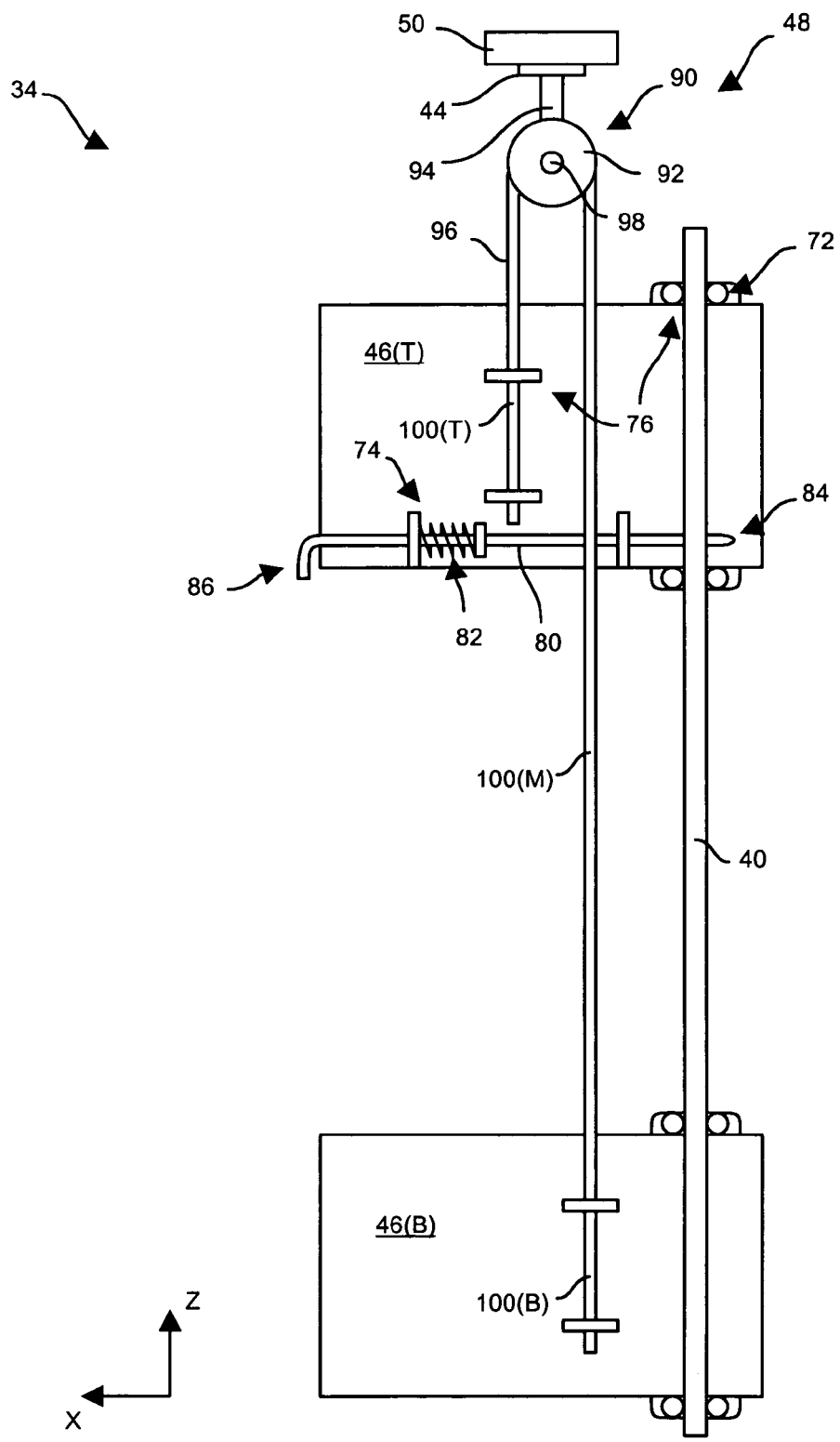
FIG. 3 is a block diagram illustrating relationships of various components of the power supply positioning assembly relative to a vertical rail of an electronic cabinet of the electronic system of FIG. 1.
Figure 4:
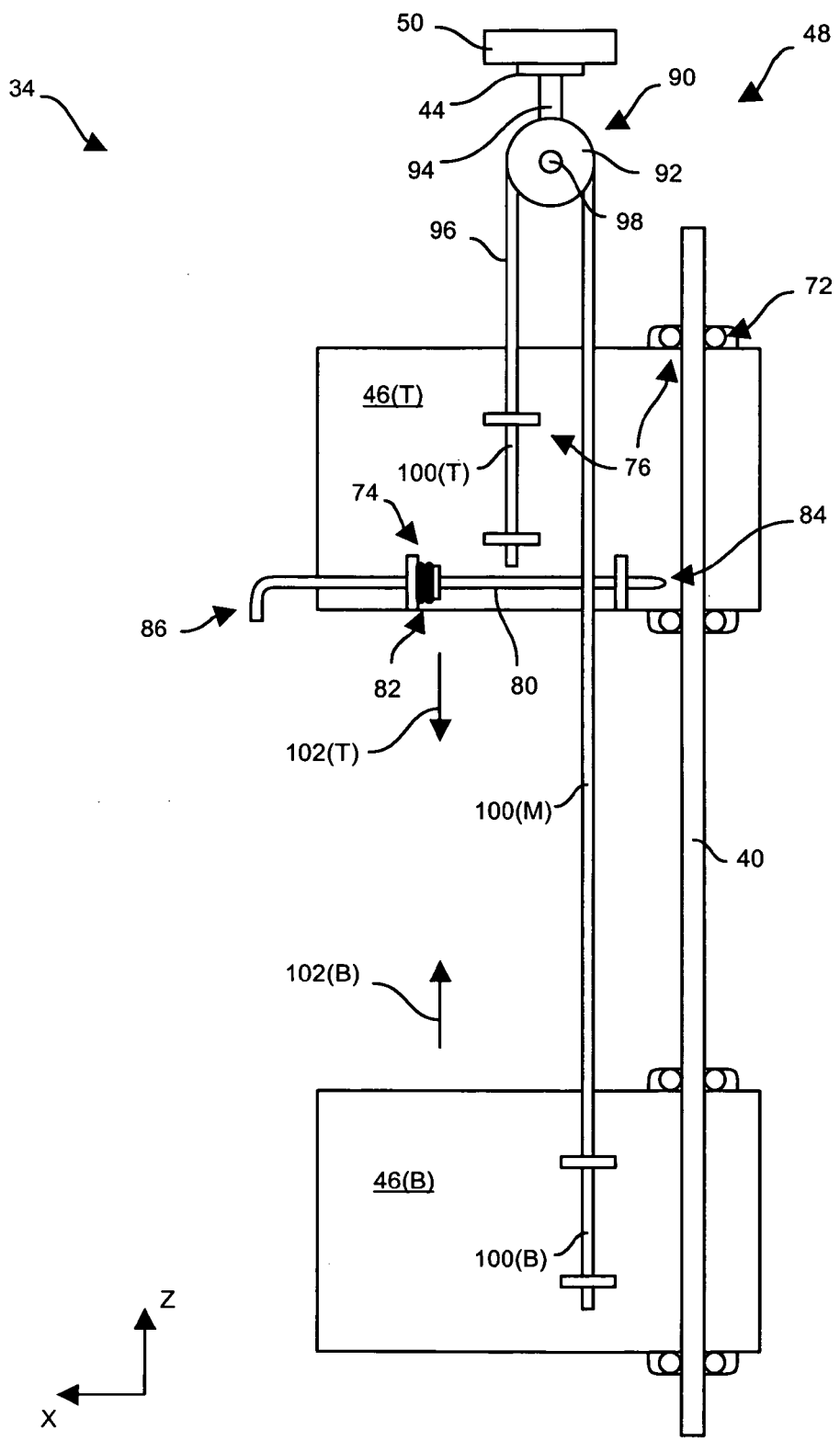
FIG. 4 is a block diagram illustrating the power supply positioning assembly in a first position.
Figure 5:
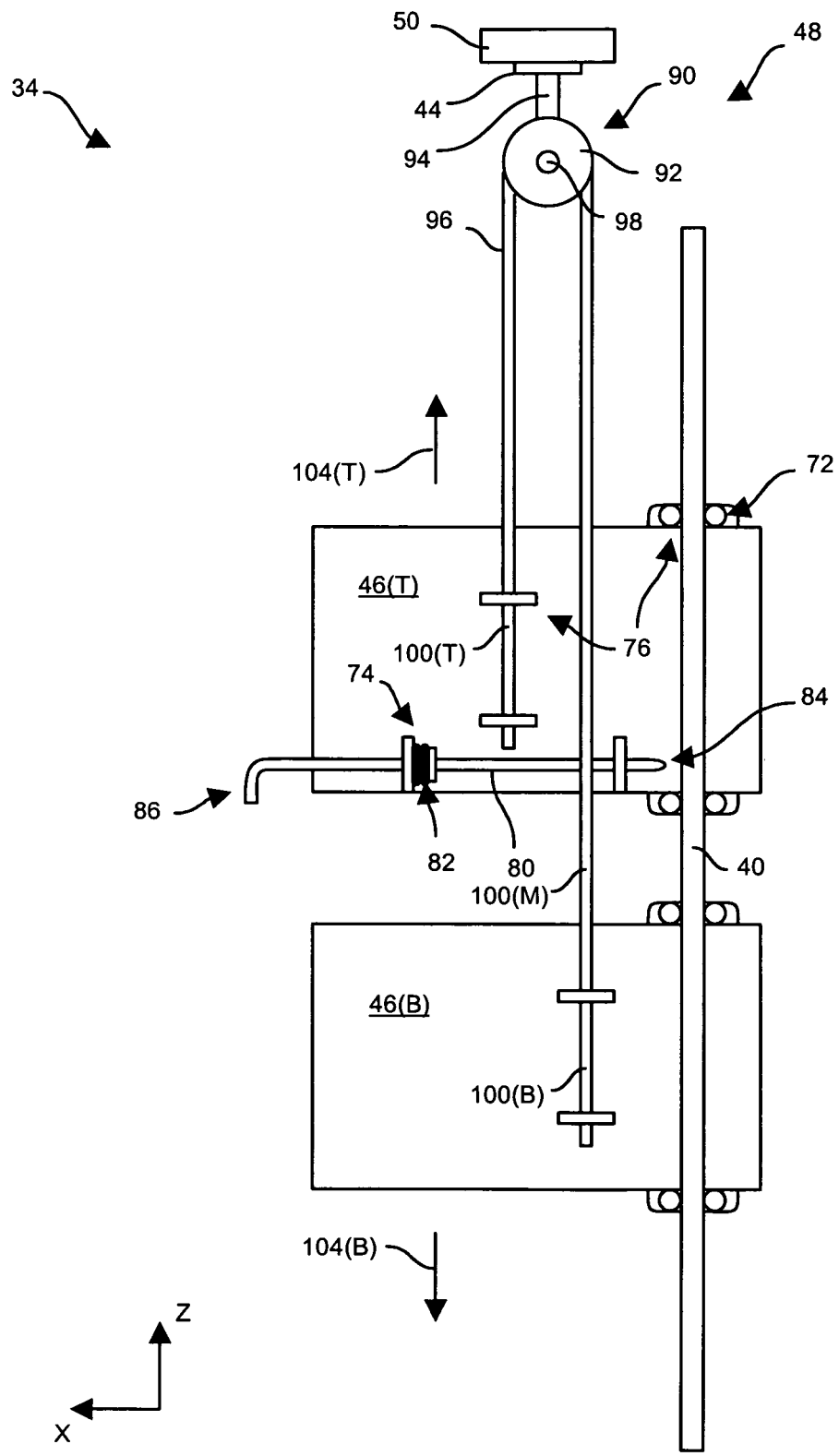
FIG. 5 is a block diagram illustrating the power supply positioning assembly in a second position.

FIGS. 3 through 5 show a side view of particular portions of power supply positioning assembly 34 during operation of the electronic system 20. The control linkage 48 includes a set of pulleys 90. Although only one pulley 90 and associated carrier components 72, 74, 76 are shown in FIGS. 3 through 5 on the sides of the chassis 70 in view in FIGS. 3 through 5, it should be understood that another pulley 90 and associated carrier components 72, 74, 76 exists on the opposite sides of the chassis 70 to keep the sides of the chassis 70 even (e.g., also see FIG. 1 for a perspective view of the carriers 46).

As shown in FIGS. 3 through 5, each pulley 90 includes a wheel 92, a wheel mount 94, and a cable 96. The wheel mount 94 connects to the electronic cabinet frame 34 (e.g., see the top portion 50 in FIG. 1) and is configured to keep the wheel 92 in a fixed location but allow the wheel 92 to rotate about an axis 98. The cable 96 has one end 100(T) which attaches to the carrier 46(T), and another end 100(R) which attaches to the carrier 46(B). A mid-section 100(M) of the cable 96 is configured to hang on the wheel 92, and turn the wheel 92 about the axis 98 as the cable 96 moves in response to user movement of the carriers 46.

The rollers 72 and the connecting hardware 76 of each carrier 46 operate to retain the chassis 70 of that carrier 46 at a fixed displacement relative to a vertical rail 40 of the frame 34 along the X-axis. That is, the rollers 72 maintain contact with the vertical rail 40 at all times to prevent the chassis 70 from moving horizontally relative to the vertical rail 40.

As shown in FIG. 3, in connection with the carrier 46(T), the end 84 of the lever 80 in view is in an engaged position relative to the vertical rail 40. In particular, the end 84 of the lever 80 passes through one of a series of holes 90 (shown generally by the arrow 90 in FIG. 3) along the vertical rail 40 thus locking the carrier 46(T) in place along the Y-axis. The spring 82 provides a biasing force which pushes the lever 80 horizontally in the negative X-direction to maintain engagement of the lever 80 in the absence of user intervention. Accordingly, both the top carrier 46(T) and the bottom carrier 46(B) cannot currently move along the vertical axis.

It should be understood that the locking mechanism 74 is not necessary all chassis 70. For example, as shown in FIGS. 3 through 5, there is no locking mechanism 74 for the chassis 70 of the bottom carrier 46(B).

When the user wishes to move the carriers 46, the user is capable of operating the power supply positioning assembly 34 simply by maneuvering the levers 80. For example, suppose that the carriers 46 are currently locked in the positions shown in FIG. 3 where the carriers 46 are maximally displaced from each other. Further suppose that the user wishes to move the carriers 46 out of the way thus clearing the way to easily access a currently obstructed portion of the electronic circuitry 26 (e.g., field replaceable units) through the rear opening 42(R) (also see FIG. 1). In this situation, the user pulls the ends 86 of the levers 80 in the positive X-direction out of engagement with the vertical rail 40 as shown in FIG. 4. The user overcomes the biasing forces provided by the springs 82 thus compressing the springs 82. At this point, the carriers 46 are capable of moving in the vertical direction along the Y-axis. The user then moves the levers 80 in the downward direction (i.e., the negative Z-direction) thus moving the carrier 46(T) downward. As a result, the carriers 46 move toward each other, i.e., the carrier 46(T) moves down and the carrier 46(B) moves up (see the arrows 102(T), 102(B) in FIG. 4).

When the user has moved the carriers 46 so that the carriers 46 no longer obstruct the portion of the electronic circuitry 24 that the user wishes to access, the user releases the levers 80 so that the springs 84 decompress thus moving the levers 80 so that the ends 84 of the levers 80 re-engage the vertical rail 40 through new holes 90. Accordingly, the carriers 46 are again safely locked into place along the vertical axis and do not move further along the vertical axis.

As another example, suppose that the carriers 46 are currently locked to the vertical rail 40 and are adjacent to each other. Further suppose that the user now wishes to move the carriers 46 out of the way again to clear the way to easily access another portion of the electronic circuitry 26 (e.g., other field replaceable units) through the rear opening 42(R) (also see FIG. 1). In this situation, the user pulls the ends 86 of the levers 80 in the positive X-direction out of engagement with the vertical rail 40 as shown in FIG. 5. Again, the carriers 46 are capable of moving in the vertical direction along the Y-axis. Accordingly, the user moves the carrier 46(T) in the upward direction while holding the levers 80 (i.e., the positive Z-direction). As a result, the carriers 46 move away from each other, i.e., carrier 46(T) moves up and the carrier 46(B) moves down (see the arrows 104(T), 104(B) in FIG. 5).

Again, when the user has moved the carriers 46 so that the carriers 46 no longer obstruct the portion of the electronic circuitry 24 that the user wishes to access, the user releases the levers 80 so that the ends 84 of the levers 80 re-engage the vertical rail 40 through new holes 90 (e.g., see FIG. 3). Thus, the carriers 46 are again safely locked into place along the vertical axis and the user has convenient access to the desired portion of the electronic circuitry 26.

It should be understood that the above-described movement of the carriers 46 is capable of occurring while the electronic system 20 is in operation electronically. In particular, the cable management subsystem 28 continuously connects the power supply subsystem 24 with the electronic circuitry 26 while the carriers 46 carrying the power supply subsystem 24 moves along the vertical axis. Since electrical connectivity is maintained during movement of the power supplies 52, the electronic system 20 is very well-suited for hot-swapping hardware for high system availability.

It should be further understood that preferably each carrier 46 has substantially the same weight in order to utilize the full advantage provided by the pair of pulleys 90. In particular, each carrier 46 preferably holds the same number of individual power supplies 52 so that each carrier 46 operates as a counterbalance to the other. Accordingly, it is relatively effortless for the user to move the carriers 46 either toward each other or away from each other. The pulleys 90 are preferably configured and proportioned for minimal resistance and maximum reliability. In some arrangements, each carrier 46 holds substantially more than 200 lbs. of power supplies 52 (e.g., 250 lbs. of power supply circuitry in each carrier 46 for a total of 500 lbs. of power supply circuitry moved by the user) which is such a large amount of weight that it would be impractical for the user to move the power supplies 52 otherwise. In some arrangements, each carrier 46 does not hold an equal number of power supplies 52, and the user compensates by placing weight in one of the carriers 46 to obtain better counterbalancing. In some arrangements, the entire power supply subsystem 24 resides in a single carrier 46 (e.g., the upper carrier 46(T)), and a simple counterbalance weight resides in place of the other carrier 46. In some arrangements, the carriers 46 hold circuitry other than power supply circuitry.

As mentioned above, embodiments of the invention are directed to techniques for moving a power supply 52 (e.g., of a power supply subsystem 24) along a vertical axis within an electronic cabinet 22. Preferably, such techniques enable the power supply 52 to continue to provide power to circuitry 26 within the cabinet 22 while a user moves the power supply 52 along the vertical axis thus permitting sustained operation (i.e., high availability). As a result, a manufacturer is capable of optimizing utilization of both the front 42(F) and rear 42(R) of the cabinet 22 while maintaining complete access to frequently accessed circuits 26. For example, in the context of a data storage system, a manufacturer is capable of placing maximum disk drive density at the front 42(F) of the cabinet 22 and maximum circuit board module density at the rear 42(R) of the cabinet 22, with none of the circuitry 60, 62 being inconveniently concealed by a power supply 52 since a user can move the power supply 52 out of the way along the vertical axis while the data storage system remains up and running.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electronic system, comprising:
    electronic circuitry;
    a power supply; and
    an electronic cabinet having a base, an electronic cabinet frame which extends vertically from the base and which supports electronic circuitry, and a power supply positioning assembly including:
        a mounting mechanism mounted to the electronic cabinet frame,
        a carrier which carries the power supply and which is configured to move along a vertical axis within the electronic cabinet frame, and
        control linkage coupled to the carrier and to the mounting mechanism, the control linkage being configured to guide movement of the carrier while the carrier moves along the vertical axis;
    wherein the electronic cabinet frame includes a vertical rail;
    wherein the carrier of the power supply positioning assembly includes a chassis which is configured to hold the power supply, and retaining members coupled to the chassis, the retaining members being configured to substantially maintain the chassis a fixed distance from the vertical rail;
    wherein the retaining members include rollers which substantially maintain contact with the vertical rail to prevent the chassis from moving horizontally relative to the vertical rail;
    wherein the power supply positioning assembly further comprises another carrier which is configured to carry another power supply and move along the vertical axis within the electronic cabinet frame while carrying the other power supply; and
    wherein the control linkage includes a pair of pulleys, each pulley having (i) a wheel which resides in a fixed location relative to the mounting mechanism and (ii) a cable which rides along the wheel, the cable having a first end attached to the carrier and a second end attached to the other carrier.

2. The electronic system of claim 1, further comprising:
    a cable management system configured to continuously connect the electronic circuitry with the power supply while the carrier carrying the power supply moves along the vertical axis.

3. The electronic system of claim 1 wherein each carrier is configured to carry power supply circuitry weighing at least 200 lbs.

4. The electronic system of claim 1 wherein the carrier further includes:
    a lever coupled to the chassis, the lever having a first end configured to engage the vertical rail and a second end configured to be pulled by a user; and
    a spring which biases the lever in a direction along a horizontal axis toward the vertical rail, the lever locking the chassis to the vertical rail when the lever is in a first position along the horizontal axis and enabling the chassis to move relative to the vertical rail when the lever is in a second position along the horizontal axis.

5. The electronic system of claim 1 wherein the pair of pulleys is configured to move the carrier in a downward direction when the pair of pulleys moves the other carrier in an upward direction, and wherein the pair of pulleys is configured to move the carrier in the upward direction when the pair of pulleys moves the other carrier in the downward direction.

6. The electronic system of claim 1 wherein the carrier and the other carrier are configured to move the power supply and the other power supply while the power supply and the other power supply remain in electronic operation.

7. An electronic cabinet, comprising:
    a base;
    an electronic cabinet frame which extends vertically from the base, the electronic cabinet frame being configured to support electronic circuitry; and
    a power supply positioning assembly which includes:
        a mounting mechanism mounted to the electronic cabinet frame,
        a carrier which is configured to carry a power supply and move along a vertical axis within the electronic cabinet frame while carrying the power supply, and
        control linkage coupled to the carrier and to the mounting mechanism, the control linkage being configured to guide movement of the carrier while the carrier carries the power supply and while the carrier moves along the vertical axis;
    wherein the electronic cabinet frame includes a vertical rail;
    wherein the carrier of the power supply positioning assembly includes a chassis which is configured to hold the power supply, and retaining members coupled to the chassis, the retaining members being configured to substantially maintain the chassis a fixed distance from the vertical rail;
    wherein the retaining members of the carrier include rollers which substantially maintain contact with the vertical rail to prevent the chassis from moving horizontally relative to the vertical rail;
    wherein the power supply positioning assembly further includes another carrier which is configured to carry another power supply and move along the vertical axis within the electronic cabinet frame while carrying the other power supply; and
    wherein the control linkage includes:
    a pair of pulleys, each pulley having (i) a wheel which resides in a fixed location relative to the mounting mechanism and (ii) a cable which rides along the wheel, the cable having a first end attached to the carrier and a second end attached to the other carrier.

8. The electronic cabinet of claim 7 wherein the pulleys of the control linkage are configured to selectively move the carrier and the other carrier (i) toward each other along the vertical axis, and (ii) away from each other along the vertical axis.

9. The electronic cabinet of claim 8 wherein the pulleys are configured to use the power supply and the other power supply as counterbalances when the carrier carries the power supply and the other carrier carries the other power supply.

10. The electronic cabinet of claim 9 wherein each carrier is configured to carry power supply circuitry weighing at least 200 lbs.

11. The electronic cabinet of claim 7 wherein the carrier further includes:
    a lever coupled to the chassis, the lever having a first end configured to engage the vertical rail and a second end configured to be pulled by a user; and a spring which biases the lever in a direction along a horizontal axis toward the vertical rail, the lever locking the chassis to the vertical rail when the lever is in a first position along the horizontal axis and enabling the chassis to move relative to the vertical rail when the lever is in a second position along the horizontal axis.

12. The electronic system of claim 7 wherein the pair of pulleys is configured to move the carrier in a downward direction when the pair of pulleys moves the other carrier in an upward direction, and wherein the pair of pulleys is configured to move the carrier in the upward direction when the pair of pulleys moves the other carrier in the downward direction.

13. The electronic cabinet of claim 7 wherein the carrier and the other carrier are configured to move the power supply and the other power supply while the power supply and the other power supply remain in electronic operation.

14. A power supply positioning assembly, comprising:
a mounting mechanism which is configured to mount to an electronic cabinet frame;
a carrier which is configured to carry a power supply and move along a vertical axis within the electronic cabinet frame while carrying the power supply; and
control linkage coupled to the carrier and to the mounting mechanism, the control linkage being configured to guide movement of the carrier while the carrier carries the power supply and while the carrier moves along the vertical axis;
wherein the electronic cabinet frame includes a vertical rail;
wherein the carrier of the power supply positioning assembly includes a chassis which is configured to hold the power supply, and retaining members coupled to the chassis, the retaining members being configured to substantially maintain the chassis a fixed distance from the vertical rail;
wherein the retaining members include rollers which substantially maintain contact with the vertical rail to prevent the chassis from moving horizontally relative to the vertical rail;
wherein the power supply positioning assembly further comprises another carrier which is configured to carry another power supply and move alone the vertical axis within the electronic cabinet frame while carrying the other power supply; and
wherein the control linkage includes:
a pair of pulleys, each pulley having (i) a wheel which resides in a fixed location relative to the mounting mechanism and (ii) a cable which rides along the wheel, the cable having a first end attached to the carrier and a second end attached to the other carrier.

15. The power supply positioning assembly of claim 14 wherein the pulleys are configured to selectively move the carrier and the other carrier (i) toward each other along the vertical axis, and (ii) away from each other along the vertical axis.

16. The power supply positioning assembly of claim 15 wherein the pulleys are configured to use the power supply and the other power supply as counterbalances when the carrier carries the power supply and the other carrier carries the other power supply.

17. The power supply positioning assembly of claim 16 wherein each carrier is configured to carry power supply circuitry weighing at least 200 lbs.

18. The power supply positioning assembly of claim 14 wherein the carrier further includes:
a lever coupled to the chassis, the lever having a first end configured to engage the vertical rail and a second end configured to be pulled by a user; and
a spring which biases the lever in a direction along a horizontal axis toward the vertical rail, the lever locking the chassis to the vertical rail when the lever is in a first position along the horizontal axis and enabling the chassis to move relative to the vertical rail when the lever is in a second position along the horizontal axis.

19. The electronic system of claim 14 wherein the pair of pulleys is configured to move the carrier in a downward direction when the pair of pulleys moves the other carrier in an upward direction, and wherein the pair of pulleys is configured to move the carrier in the upward direction when the pair of pulleys moves the other carrier in the downward direction.

20. The power supply positioning assembly of claim 14 wherein the carrier and the other carrier are configured to move the power supply and the other power supply while the power supply and the other power supply remain in electronic operation.

* * * * *

UNITED STATES PATENT AND TRADEMARK OFFICE
CERTIFICATE OF CORRECTION

PATENT NO.        : 7,123,485 B1                                              Page 1 of 1
APPLICATION NO. : 11/008861
DATED             : October 17, 2006
INVENTOR(S)       : David Henderson It is certified that error appears in the above-identified patent and that said Letters Patent is hereby corrected as shown below:

Claim 12, Column 9, Line 10, "direction," should read -- direction; --.
Claim 19, Column 10, Line 32, "The electronic system" should read --The power supply positioning assembly --.
Claim 19, Column 10, Line 35, "direction," should read -- direction; --.

Signed and Sealed this

Ninth Day of January, 2007

JON W. DUDAS
*Director of the United States Patent and Trademark Office*